(12) United States Patent
Nonami et al.

(10) Patent No.: US 8,007,959 B2
(45) Date of Patent: Aug. 30, 2011

(54) PHOTOMASK AND PATTERN FORMATION METHOD USING THE SAME

(75) Inventors: Yuji Nonami, Kyoto (JP); Akio Misaka, Osaka (JP); Shigeo Irie, Toyama (JP)

(73) Assignee: Panasonic Corporation, Osaka (JP)

( * ) Notice: Subject to any disclaimer, the term of this patent is extended or adjusted under 35 U.S.C. 154(b) by 234 days.

(21) Appl. No.: 12/181,650

(22) Filed: Jul. 29, 2008

(65) Prior Publication Data

US 2009/0061328 A1    Mar. 5, 2009

(30) Foreign Application Priority Data

Aug. 29, 2007    (JP) ................. 2007-222142

(51) Int. Cl.
   *G03F 1/00*     (2006.01)
   *G03F 9/00*     (2006.01)
   *H01L 21/00*    (2006.01)

(52) U.S. Cl. ................. 430/5; 430/22; 430/311

(58) Field of Classification Search ............... 430/5, 22, 430/311
   See application file for complete search history.

(56) References Cited

U.S. PATENT DOCUMENTS

| | | | | |
|---|---|---|---|---|
| 5,723,236 | A * | 3/1998 | Inoue et al. | 430/5 |
| 5,725,969 | A | 3/1998 | Lee | |
| 5,888,674 | A | 3/1999 | Yang et al. | |
| 6,207,333 | B1 * | 3/2001 | Adair et al. | 430/5 |
| 6,255,023 | B1 * | 7/2001 | Huang et al. | 430/5 |
| 6,413,684 | B1 * | 7/2002 | Stanton | 430/5 |
| 6,703,168 | B1 * | 3/2004 | Misaka | 430/5 |
| 7,060,395 | B2 | 6/2006 | Misaka | |
| 7,060,398 | B2 | 6/2006 | Misaka | |
| 7,147,975 | B2 | 12/2006 | Misaka | |
| 2002/0197544 | A1 | 12/2002 | Iwasaki | |
| 2005/0069788 | A1 | 3/2005 | Tanaka et al. | |
| 2005/0277034 | A1 | 12/2005 | Mitsui | |
| 2006/0093963 | A1 * | 5/2006 | Terahara | 430/311 |
| 2006/0121364 | A1 * | 6/2006 | Omura | 430/5 |
| 2007/0003879 | A1 * | 1/2007 | Chang et al. | 430/311 |
| 2009/0061328 | A1 | 3/2009 | Nonami et al. | |
| 2009/0061330 | A1 | 3/2009 | Irie et al. | |

FOREIGN PATENT DOCUMENTS

| | | |
|---|---|---|
| JP | 09-281690 | 10/1997 |
| JP | 2001-296647 | 10/2001 |
| JP | 2003-322949 | 11/2003 |

OTHER PUBLICATIONS

United States Office Action, issued in U.S. Appl. No. 12/200,478, mailed Jun. 15, 2010.
United States Office Action, issued in U.S. Appl. No. 12/204,252, mailed Jun. 23, 2010.
United States Office Action issued in U.S. Appl. No. 12/200,478, mailed Nov. 15, 2010.
United States Notice of Allowance issued in U.S. Appl. No. 12/204,252, mailed Nov. 17, 2010.

* cited by examiner

*Primary Examiner* — Mark F Huff
*Assistant Examiner* — Jonathan Jelsma
(74) *Attorney, Agent, or Firm* — McDermott Will & Emery LLP

(57) ABSTRACT

A photomask includes a transparent substrate having a transparent property against exposing light and a halftone portion formed on the transparent substrate. In the halftone portion, a first opening having a first dimension and a second opening having a second dimension larger than the first dimension are formed. A light-shielding portion is formed on the transparent substrate to be disposed around the second opening.

24 Claims, 10 Drawing Sheets

PHOTOMASK AND PATTERN FORMATION METHOD USING THE SAME

BACKGROUND OF THE INVENTION

The present invention relates to a photomask used for forming a fine pattern in fabrication of a semiconductor integrated circuit device and a pattern formation method using the photomask.

Recently, there are increasing demands for refinement of a circuit pattern due to a high degree of integration of a large scale integrated circuit device (hereinafter referred to as an LSI) realized by using a semiconductor. Therefore, in lithography technique employed for forming a desired pattern on a wafer, it has become difficult to form the pattern merely by reducing the exposing wavelength λ or increasing the numerical aperture NA, and as a result, various super-resolution techniques are now employed. As one of the super-resolution techniques, an attenuated (half-tone) phase-shifting mask that is comparatively easily fabricated and is minimally restricted in the shape of a pattern to be formed is widely employed.

Figure 13A:
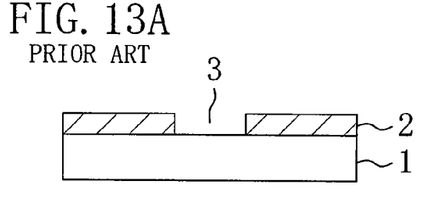
FIG. 13A is a cross-sectional view for showing an exemplified cross-sectional structure of a conventional attenuated phase-shifting mask having a small opening.

FIG. 13A shows an exemplified cross-sectional structure of the attenuated phase-shifting mask. In the attenuated phase-shifting mask of FIG. 13A, a mask pattern is provided by forming a halftone portion 2 with transmittance of 5 through 12% against incident light on a transparent substrate 1 made of quartz or glass. The halftone portion 2 inverts the phase of the incident light by 180 degrees with respect to an opening 3 formed therein. In the mask pattern thus formed, the phase of light having passed through the opening 3 is different from the phase of light having passed through the halftone portion 2 by 180 degrees in the vicinity of an edge of the halftone portion 2, and hence, these lights cancel each other. As a result, the minimum value Imin of the light intensity obtained in the vicinity of the edge of the halftone portion 2 is lowered so that high contrast can be attained.

Figure 13B:
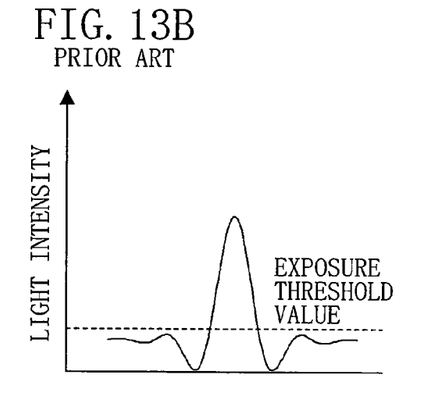
FIG. 13B is a diagram of a light intensity profile obtained in using the attenuated phase-shifting mask of FIG. 13A.
Figure 13C:
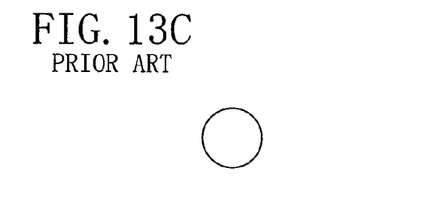
FIG. 13C is a schematic plan view of a pattern transferred onto a wafer when the opening of FIG. 13A is a hole pattern.

FIG. 13B is a diagram for showing a light intensity profile obtained by using the attenuated phase-shifting mask of FIG. 13A, and FIG. 13C is a schematic diagram for showing the plane structure of a pattern to be transferred onto a wafer when the opening 3 of FIG. 13A is a hole pattern. As shown in FIG. 13B, the highest light intensity appears at the center of the opening 3. Also, an unwanted side lobe with the local maximum value of the light intensity is caused around the opening 3 due to the influence of diffraction of the light caused at the edge of the halftone portion 2. The local maximum value of the light intensity of the side lobe is in proportion to the dimension of the opening 3.

Figure 13D:
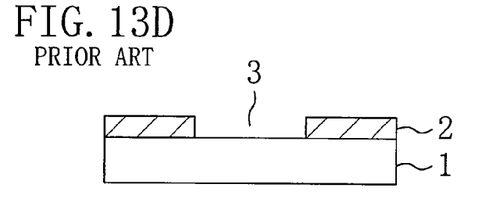
FIG. 13D is a cross-sectional view for showing an exemplified cross-sectional structure of a conventional attenuated phase-shifting mask having a large opening.

FIG. 13D shows another exemplified cross-sectional structure of the attenuated phase-shifting mask. In FIG. 13D, like reference numerals are used to refer to like elements used in the mask shown in FIG. 13A so as to avoid repetition of the description. The attenuated phase-shifting mask of FIG. 13D has a larger opening 3 than the attenuated phase-shifting mask of FIG. 13A.

Figure 13E:
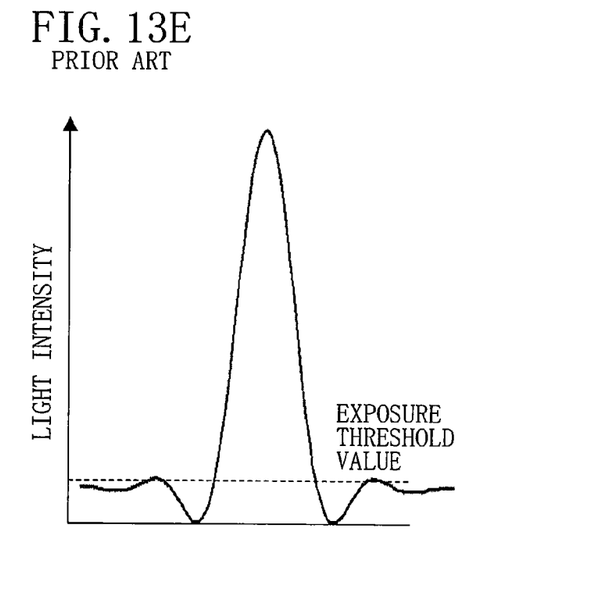
FIG. 13E is a diagram of a light intensity profile obtained in using the attenuated phase-shifting mask of FIG. 13D.
Figure 13F:
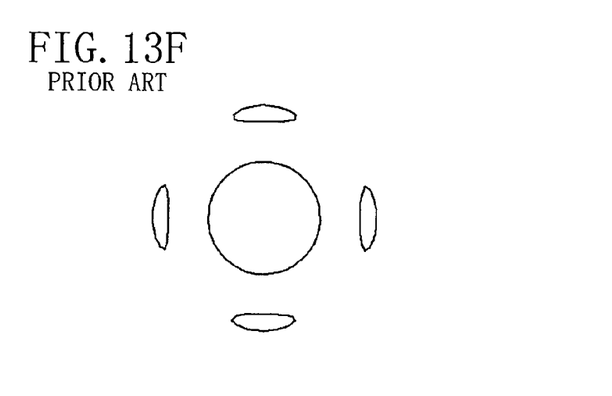
FIG. 13F is a schematic plan view of a pattern transferred onto a wafer when the opening of FIG. 13D is a hole pattern.

FIG. 13E is a diagram for showing a light intensity profile obtained by using the attenuated phase-shifting mask of FIG. 13D, and FIG. 13F is a schematic diagram for showing the plane structure of a pattern to be transferred onto a wafer when the opening 3 of FIG. 13D is a hole pattern. As shown in FIG. 13E, when the opening 3 is increased in the dimension, the local maximum value of the light intensity of the side lobe exceeds an exposure threshold value (i.e., the minimum value of the light intensity for sensitizing a resist to be exposed). As a result, an unwanted pattern (a side lobe pattern) is disadvantageously transferred onto the wafer as shown in FIG. 13F.

As a method for preventing the occurrence of a side lobe, mask bias (modification of a mask pattern caused by proximity correction or the like) is increased and exposure is reduced. In this method, however, the contrast is disadvantageously lowered. Accordingly, in a mask pattern having an opening with a dimension not more than 0.5×λ/NA (wherein λ is a wavelength of exposing light and NA is a numerical aperture of a reduction projecting optical system of an aligner; which are also applied in description below) difficult to attain sufficient contrast, the maximum exposure and the minimum mask bias not causing a side lobe is employed for attaining higher contrast. Alternatively, in a mask pattern having both a first opening with a first dimension not more than 0.5×λ/NA and a second opening with a second dimension larger than 0.5×λ/NA, the exposure is set to one for attaining high contrast for the first opening with the first dimension. In such a case, however, since the local maximum value of the light intensity of a side lobe is in proportion to the dimension of an opening as described above, the local maximum value of the light intensity of the side lobe exceeds the exposure threshold value with respect to the second opening with the second dimension.

Figure 14:
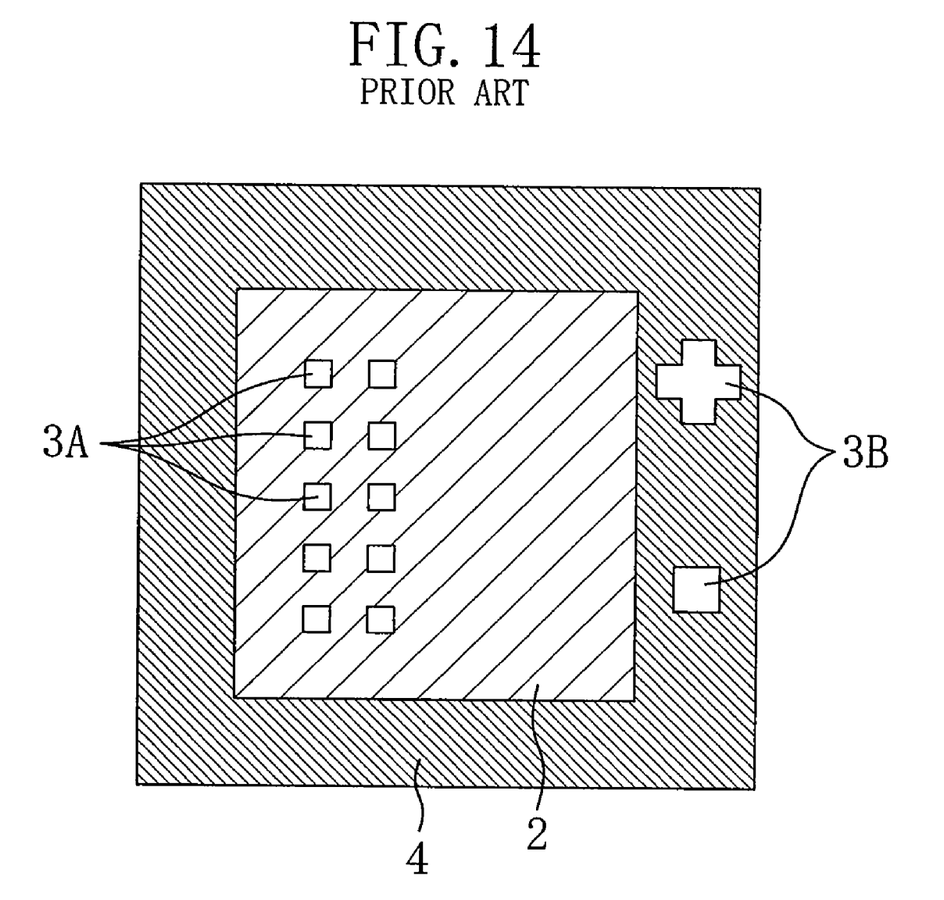
FIG. 14 is a plan view of a conventional photomask disclosed in Patent Document 1.

In order to overcome this problem, Patent Document 1 (Japanese Laid-Open Patent Publication No. 9-281690) discloses a method in which a second opening is formed in a light-shielding region made of a light-shielding portion for preventing the occurrence of a side lobe in the second opening. FIG. 14 is a plan view of a conventional photomask disclosed in Patent Document 1. As shown in FIG. 14, a halftone portion 2 is provided at the center of a transparent substrate (not shown), and a light-shielding portion 4 is provided in the periphery of the transparent substrate. The halftone portion 2 is provided with first openings 3A each having a first dimension not more than 0.5×λ/NA, and the light shielding portion 4 is provided with second openings 3B each having a second dimension larger than 0.5×λ/NA.

SUMMARY OF THE INVENTION

In the case where the conventional photomask disclosed in Patent Document 1 is used, however, there arises a problem that a resist defect is caused around a portion on a wafer corresponding to the second opening. This problem is serious in employing ArF exposure process and particularly ArF immersion exposure process.

An object of the invention is simultaneously preventing the occurrence of a side lobe and the occurrence of a resist defect even in using an attenuated phase-shifting mask having a plurality of openings with different dimensions.

In order to achieve the object, the present inventors have studied the cause of a resist defect occurring around a portion on a wafer corresponding to an opening (a second opening) with a dimension larger than 0.5×λ/NA in using the conventional photomask disclosed in Patent Document 1, resulting finding the following:

In accordance with recent refinement, a chemically amplified resist is used in more and more cases. In pattern formation using a chemically amplified resist, an acid having a catalytic function is produced through a photochemical reaction caused in exposure, and the acid is used as a catalyst in a reaction of functional groups included in a resist polymer in annealing process performed after the exposure, so as to form a pattern by utilizing property change caused in the reaction. In this case, in positive resist process, a pattern is formed by dissolving, in a developer, merely a portion irradiated with exposing light for reacting the functional groups.

A chemically amplified resist is known to have a characteristic of very high reactivity. Particularly, an ArF resist used in the ArF exposure process has high reactivity, and since a surface portion of the resist is easily reacted with any ambient substance, an insoluble layer insoluble in the developer is frequently formed in the vicinity of the surface of the resist.

Furthermore, in pattern formation of an LSI of a 45 nm or finer rule, immersion exposure has been employed for preventing degradation of a DOF (depth of focus) derived from increase of the NA. In the immersion exposure, the exposure is performed with a liquid having a higher refractive index than the air (hereinafter referred to as the immersion liquid) present on a wafer. In the immersion exposure, in order to prevent resist characteristic degradation derived from direct contact between a resist and the immersion liquid, the direct contact between the resist and the immersion liquid is avoided by coating the resist surface with a resist protection film designated as a top coat. Although the direct contact between the resist and the immersion liquid can be avoided by using the top coat, since the resist is in direct contact with the top coat, a chemical reaction is caused on the contact face therebetween, so that an insoluble layer insoluble in the developer can be more easily formed.

When a region of the resist where the insoluble layer is formed is irradiated with light, the resist surface is dissolved during development and adhesion between the insoluble layer and the resist is lowered, and hence, the insoluble layer can be easily removed out of the wafer through rinsing process performed after the development.

On the other hand, in a completely unexposed region not irradiated with the light at all (namely, a region with light intensity of zero), the adhesion between the insoluble layer and the resist is not lowered, and hence, the insoluble layer cannot be removed out of the wafer through the rinsing process. Therefore, the insoluble layer scatters around the completely unexposed region, resulting in causing a resist defect on the wafer.

In the conventional photomask disclosed in Patent Document 1, the second opening 3B with the second dimension larger than $0.5\times\lambda/NA$ is disposed in the light-shielding portion 4 (light-shielding region) for preventing the occurrence of a side lobe as shown in FIG. 14. Therefore, since there is a completely unexposed region due to the light-shielding portion 4, when the ArF exposure process and more particularly the ArF immersion exposure process is employed, there arises a problem that a resist defect derived from an insoluble layer is caused around a portion of the wafer corresponding to the second opening 3B.

The present invention was devised on the basis of the aforementioned finding, and the photomask of this invention includes a transparent substrate having a transparent property against exposing light; a halftone portion formed on the transparent substrate; a first opening formed in the halftone portion and having a first dimension; a second opening formed in the halftone portion and having a second dimension lager than the first dimension; and a light-shielding portion formed on the transparent substrate around the second opening.

It is noted that a dimension of an opening herein means a length of one side when the opening has, for example, a square plane shape, and means a diameter when the opening has, for example, a circular plane shape, and the plane shape of the opening is not particularly specified.

Furthermore, to have a transparent property against exposing light herein means to have transmittance sufficiently high for sensitizing a resist, and to have a light-shielding property against exposing light herein means to have transmittance sufficiently low for not sensitizing a resist. Also, an identical phase means that there is a phase difference not less than $(-30+360\times n)$ degrees and not more than $(30+360\times n)$ degrees (wherein n is an integer), and an opposite phase means that there is a phase difference not less than $(150+360\times n)$ degrees and not more than $(210+360\times n)$ degrees.

Figure 1A:
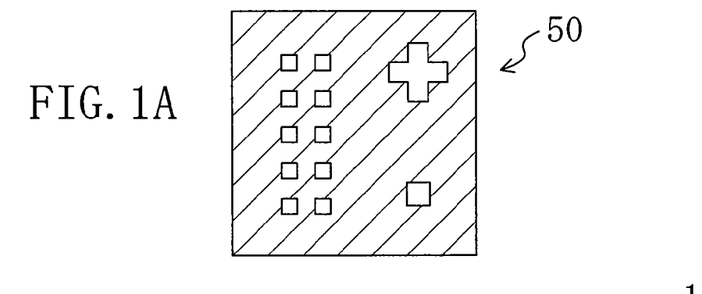
FIG. 1A is a diagram of an exemplified pattern to be formed by using a photomask according to an embodiment of the invention.
Figures 1B, 1C:
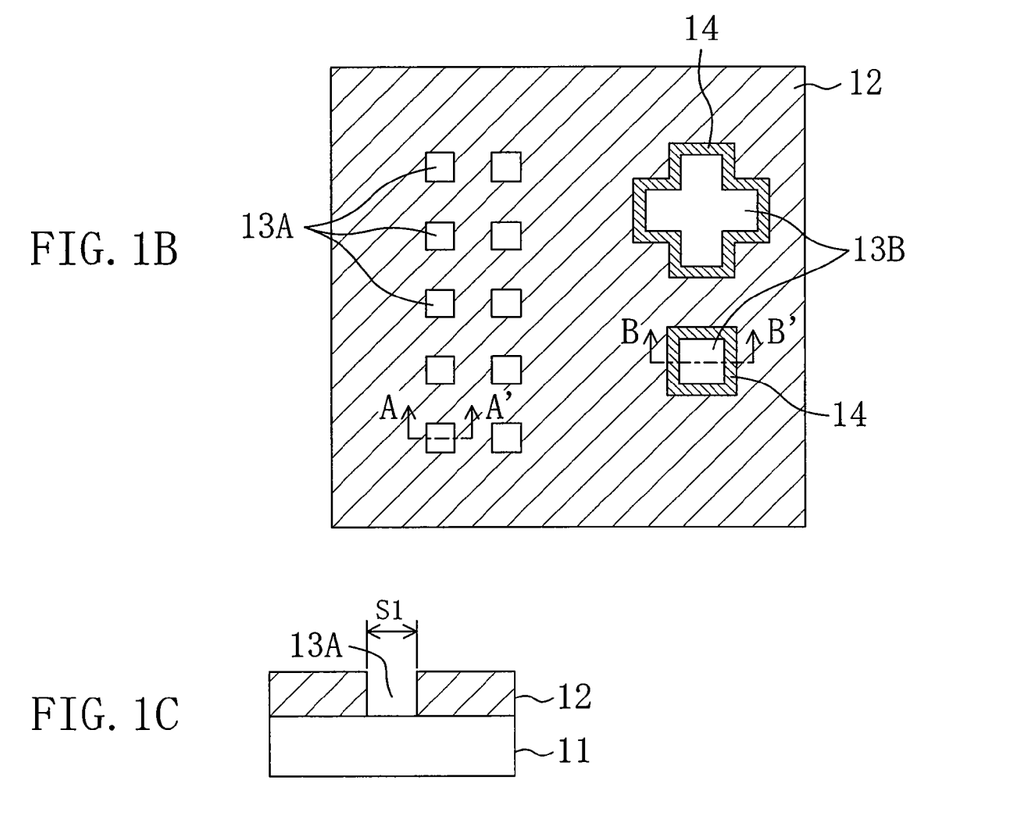
FIG. 1B is a plan view of an exemplified photomask according to the embodiment of the invention.
FIG. 1C is a cross-sectional view taken on line A-A' of FIG. 1B
Figure 1D:
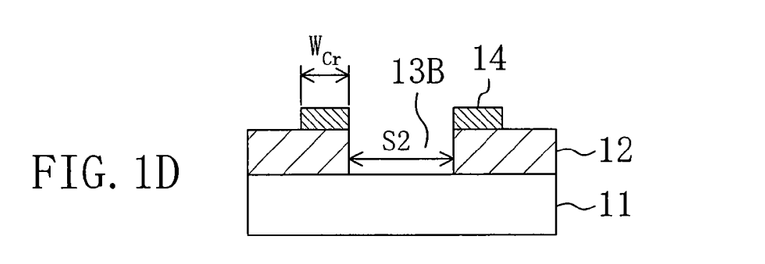
FIG. 1D is a cross-sectional view taken on line B-B' of FIG. 1B.

FIG. 1B is a plan view of a specific example of a photomask (an attenuated phase-shifting mask) according to the present invention, FIG. 1C is a cross-sectional view taken on line A-A' of FIG. 1B and FIG. 1D is a cross-sectional view taken on line B-B' of FIG. 1B. As shown in FIGS. 1B through 1D, in a halftone portion 12 formed on a transparent substrate 11, first openings 13A each having a first dimension not more than, for example, $(0.5\times\lambda/NA)\times M$ (wherein $\lambda$ is a wavelength of the exposing light, NA is numerical aperture of a reduction projection optical system of an aligner and M is a reduction ratio of the reduction projection optical system) and second openings 13B each having a second dimension larger than, for example, $(0.5\times\lambda/NA)\times M$ are formed.

In this case, as a characteristic of the photomask of this invention shown in FIGS. 1B through 1D, a light-shielding portion 14 is provided on the transparent substrate 11 around each of the second openings 13B.

Specifically, when a dimension of the light-shielding portion 14 (namely, a Cr width $W_{Cr}$ shown in FIG. 1D) provided around each second opening 13B is set to be sufficiently large for preventing the occurrence of a side lobe and to be sufficiently small for preventing formation of a completely unexposed region in the photomask of this invention, the occurrence of a side lobe is prevented as well as the occurrence of a defect derived from an unexposed region can be prevented.

In the photomask of this invention, the Cr width $W_{Cr}$ is preferably not less than $(0.63\times\lambda/NA)\times M$ and not more than $(3.7\times\lambda/NA)\times M$. Thus, the occurrence of a side lobe can be definitely prevented and the occurrence of a defect derived from an unexposed region can be definitely prevented.

The pattern formation method of this invention in which the photomask of this invention is used includes the steps of (a) forming a resist film on a substrate; (b) irradiating the resist film with the exposing light through the photomask; and (c) patterning the resist film by developing the resist film having been irradiated with the exposing light.

In the pattern formation method of this invention, a pattern can be formed while simultaneously suppressing the occurrence of a side lobe and the occurrence of a defect derived from an unexposed region.

As described so far, according to the present invention, even when an attenuated phase-shifting mask provided with a plurality of openings with different dimensions is used, and particularly when the mask is used in combination with the ArF exposure process or the ArF immersion exposure process, the occurrence of a side lobe and the occurrence of a defect can be simultaneously prevented, so that a fine LSI can be fabricated.

Specifically, the present invention relates to a photomask used in forming a fine pattern in fabrication of a semiconductor integrated circuit device and a pattern formation method using the photomask, and is very useful for pattern formation or the like employing the ArF exposure process or the ArF immersion exposure process.

DETAILED DESCRIPTION OF THE INVENTION (Prerequisites)

Prerequisites for describing a preferred embodiment of the invention will be first described.

Since a photomask is generally used in a reduction projection type aligner, it is necessary to consider a reduction ratio in arguing a pattern dimension on the mask. However, in order to avoid confusion, in the description of the embodiment below, when a pattern dimension on a mask is mentioned in correspondence to a desired pattern to be formed (such as a resist pattern), a value obtained by converting the pattern dimension by using a reduction ratio is used unless otherwise mentioned. Specifically, in the case where a resist pattern with a width of 70 nm is formed by using a mask pattern with a width of M×70 nm in a 1/M reduction projection system, the width of the mask pattern and the width of the resist pattern are both described as 70 nm.

Also, in the embodiment of the invention, M and NA respectively indicate a reduction ratio and numerical aperture of a reduction projection optical system of an aligner and λ indicates the wavelength of exposing light unless otherwise mentioned.

Moreover, pattern formation is described on the assumption that positive resist process for forming a resist pattern correspondingly to an unexposed region of a resist is employed. In the case where negative resist process is employed instead of the positive resist process, since an unexposed region of a resist is removed in the negative resist process, a resist pattern of the positive resist process is replaced with a space pattern.

Moreover, it is assumed that a photomask described in the embodiment of the invention is a transmission mask. In the case where the present photomask is applied to a reflection mask instead of a transmission mask, since a transparent region and a light-shielding region of a transmission mask respectively correspond to a reflection region and a non-reflection region, the transmission phenomenon of a transmission mask is replaced with the reflection phenomenon. Specifically, an opening or a transparent region of a transmission mask is replaced with a reflection portion or a reflection region, and a light-shielding portion is replaced with a non-reflection portion. Furthermore, a region partially transmitting light in a transmission mask is replaced with a region partially reflecting light in a reflection mask, and transmittance is replaced with reflectance.

Embodiment

A photomask according to an embodiment of the invention will now be described with reference to the accompanying drawings.

FIG. 1A shows an example of a pattern to be formed by using the photomask according to the embodiment of the invention. Also, FIG. 1B is a plan view of an example of the photomask of this embodiment, and more specifically, an example of an attenuated phase-shifting mask used for forming a desired pattern 50 shown in FIG. 1A, FIG. 1C is a cross-sectional view taken on line A-A' of FIG. 1B and FIG. 1D is a cross-sectional view taken on line B-B' of FIG. 1B.

As shown in FIGS. 1B through 1D, in a halftone portion 12 formed on a transparent substrate 11, first openings 13A each having a first dimension S1 not more than, for example, $(0.5 \times \lambda/NA) \times M$ and second openings 13B each having a second dimension S2 larger than, for example, $(0.5 \times \lambda/NA) \times M$ are formed. The halftone portion 12 transmits exposing light in an opposite phase with respect to the first opening 13A and the second opening 13B.

When it is assumed, for example, that the exposing wavelength λ is 193 nm, the numerical aperture NA is 1.2 and the reduction ratio M is 4, each first opening 13A is formed so as to have a hole size necessary for an LSI of a 45 nm rule, and specifically, so as to be in a square shape with each side of 70 nm (corresponding to an actual dimension on the mask of 280 nm obtained by multiplying 70 nm by 4). On the other hand, each second opening 13B is an accessory pattern such as a reticle position monitor pattern (namely, a pattern for aligning a reticle against the aligner) or an overlay monitor pattern (namely, a pattern for aligning an upper layer against a lower layer). The dimension and the shape of such an accessory pattern naturally depend upon the kind of aligner. In this embodiment, a reticle position monitor pattern having a cross-shaped mark with a side of, for example, 4 μm (having a total width of 12 μm (corresponding to an actual dimension on the mask of 48 μm obtained by multiplying 12 μm by 4)) and an overlay monitor pattern having a side of, for example, 10 μm (corresponding to an actual dimension on the mask of 40 μm obtained by multiplying 10 μm by 4) are formed as the second openings 13B.

As a characteristic of the photomask of this embodiment, light-shielding portions 14 are provided on the transparent substrate 11 merely around the second openings 13B as shown in the cross-sectional view of FIG. 1C taken on line A-A' of FIG. 1B crossing the first opening 13A and in the cross-sectional view of FIG. 1D taken on line B-B' of FIG. 1B crossing the second opening 13B.

In the photomask of this embodiment, a dimension of the light-shielding portion 14 (namely, a Cr width $W_{Cr}$ shown in FIG. 1D) provided around each second opening 13B is set to be sufficiently large for preventing the occurrence of a side lobe and to be sufficiently small for preventing the formation of a completely unexposed region, and thus, the occurrence of a side lobe and the occurrence of a defect derived from an unexposed region can be both prevented.

In the case where, for example, a contact hole pattern having the first dimension not more than 0.5×λ/NA is formed as each first opening 13A, the Cr width $W_{Cr}$ set for each second opening 13B for simultaneously preventing the occurrence of a side lobe and the formation of an unexposed region is obtained through simulation as follows: In the simulation, the halftone portion 12 is set to have transmittance of, for example, 6% against the exposing light and to change the phase of the exposing light by, for example, 180 degrees. Also, the light-shielding portion 14 is set to have transmittance of 0% against the exposing light, namely, the light-shielding portion 14 is set to completely shield the exposing light.

A side lobe is caused when the energy of light passing through a halftone portion is added to a secondary peak of light intensity derived from light diffraction caused at the edge of an opening, and when the local maximum value of the light intensity of a side lobe exceeds an exposure threshold value, a portion of a resist on a wafer is sensitized and hence an unwanted pattern is disadvantageously transferred. Accordingly, in order to prevent the occurrence of a side lobe, the position of a secondary peak on a photomask is shielded by a light-shielding portion. However, when the width of the light-shielding portion (namely, the Cr width $W_{Cr}$) is too small, the occurrence of a side lobe cannot be prevented and hence, the Cr width $W_{Cr}$ needs to be large to some extent.

Figure 2:
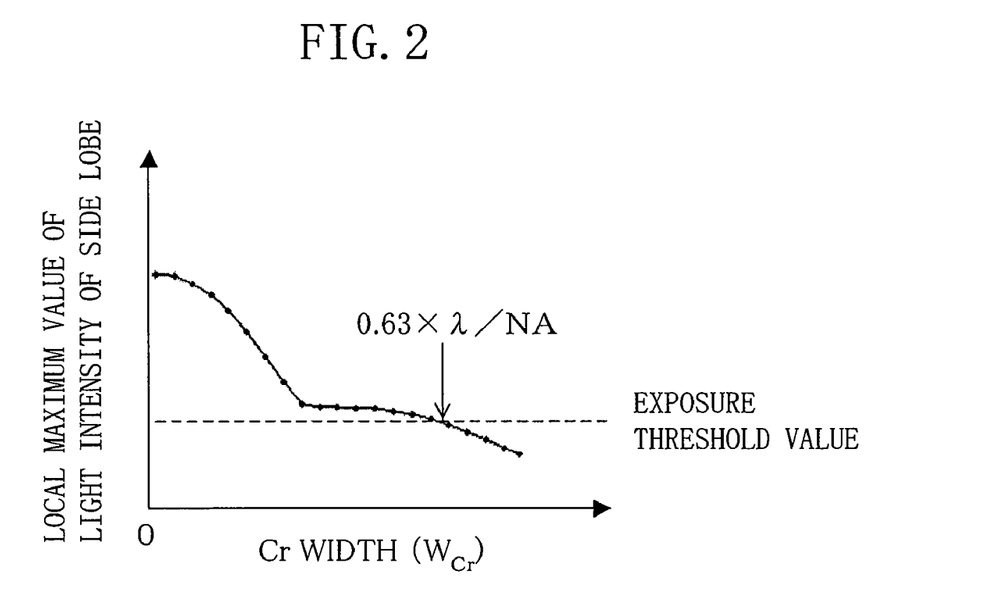
FIG. 2 is a diagram for showing the relationship, obtained by the present inventors through simulation, between the local maximum value of light intensity of a side lobe and the width of a light-shielding portion in the photomask of the embodiment of the invention.

FIG. 2 shows the relationship between the local maximum value of the light intensity of a side lobe and the Cr width $W_{Cr}$ obtained as a result of the simulation performed by the present inventors. As shown in FIG. 2, when the Cr width $W_{Cr}$ is increased, the amount of exposing light passing through the halftone portion is reduced, and hence, the local maximum value of the light intensity of a side lobe is reduced, and when the Cr width $W_{Cr}$ is not less than 0.63×λ/NA, the light intensity of a side lobe is smaller than the exposure threshold value. In other words, when the Cr width $W_{Cr}$ is not less than 0.63×λ/NA, the occurrence of a side lobe can be prevented.

On the other hand, as described in "Summary of the Invention", when the Cr width $W_{Cr}$ is increased, namely, when a light-shielding region made of a light-shielding portion is increased, a completely unexposed region is formed as a result, which leads to a defect derived from an insoluble layer in exposure process. Specifically, when the Cr width $W_{Cr}$ is small, light diffracted at the edge of an opening rounds to the back of a light-shielding portion and hence a completely unexposed region is not formed. On the other hand, when a light-shielding portion has a Cr width $W_{Cr}$ sufficiently large for avoiding influence of the light diffracted at the edge of an opening, a completely unexposed region is formed.

Figure 3:
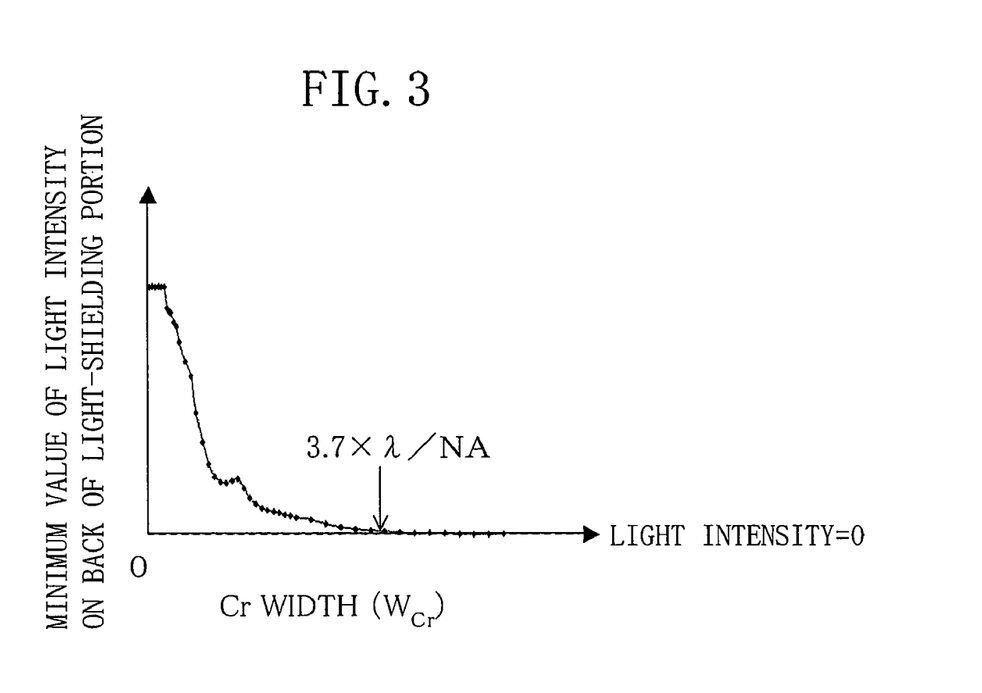
FIG. 3 is a diagram for showing the relationship, obtained by the present inventors through simulation, between the minimum value of light intensity on the back of the light-shielding portion and the width of the light-shielding portion in the photomask of the embodiment of the invention.

FIG. 3 shows the relationship between the minimum value of the light intensity on the back of a light-shielding portion and the Cr width $W_{Cr}$ obtained as a result of simulation performed by the present inventors. As shown in FIG. 3, when the Cr width $W_{Cr}$ is increased, the minimum value of the light intensity on the back of a light-shielding portion is reduced, and when the Cr width $W_{Cr}$ is larger than 3.7×λ/NA, the minimum value of the light intensity on the back of a light-shielding portion is zero and a completely unexposed region is formed. Therefore, when the Cr width $W_{Cr}$ is smaller than 3.7×λ/NA, the formation of a completely unexposed region can be prevented, so as to prevent the occurrence of a defect derived from an insoluble layer.

As described so far, when the Cr width $W_{Cr}$ of the light-shielding portion 14 provided around each second opening 13B of the photomask of this embodiment is not less than 0.63×λ/NA and not more than 3.7×λ/NA, the occurrence of a side lobe can be prevented as well as the occurrence of a defect derived from an insoluble layer resulting from a completely unexposed region can be prevented.

Although the structure as shown in FIGS. 1B through 1D is exemplified as the structure of the photomask of this embodiment, the photomask of the invention is not limited to this structure. Similar effects can be attained by employing any of structures shown in FIGS. 4A and 4B and 7 through 9.

Figure 4A:
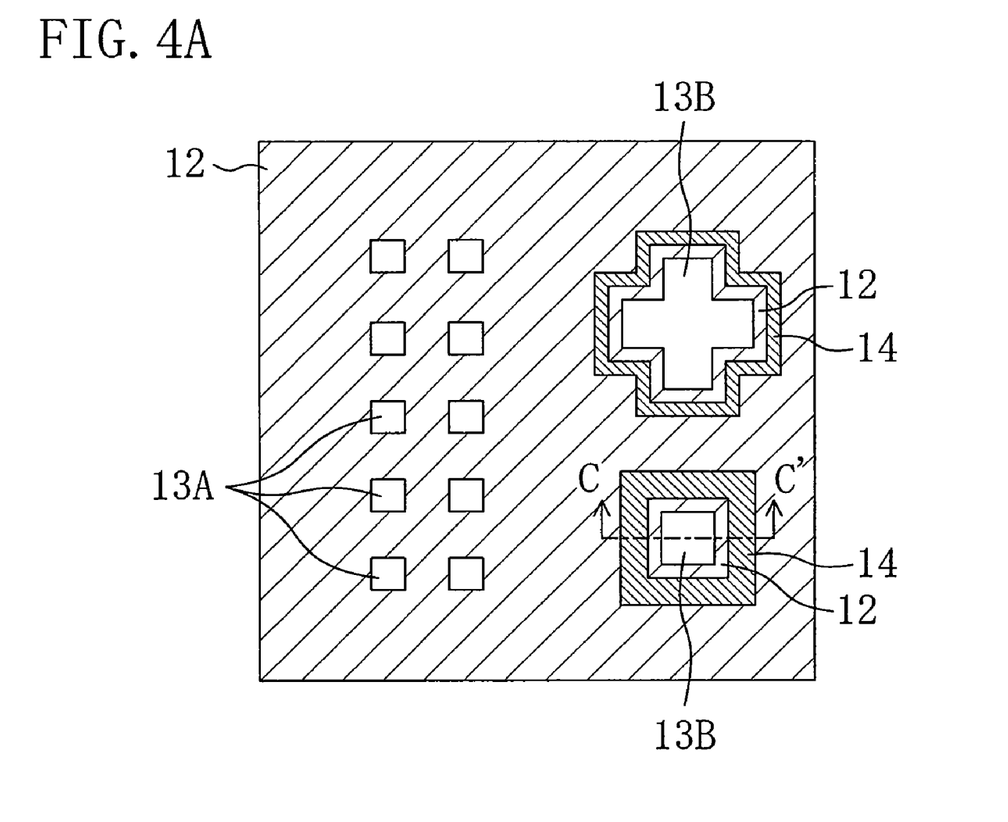
FIG. 4A is a plan view of another exemplified photomask according to the embodiment of the invention and FIG. 4B is a cross-sectional view taken on line C-C' of FIG. 4A.
Figure 4B:
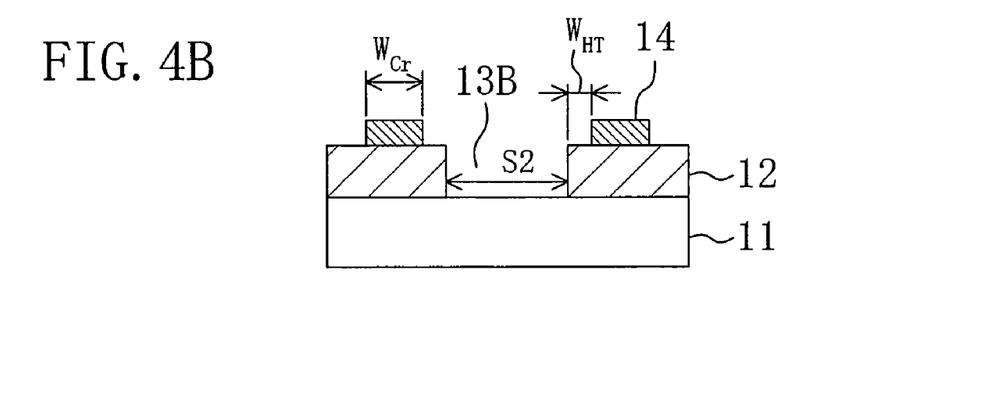

FIG. 4A is a plan view of another example of the photomask according to the embodiment of the invention, and specifically, another example of the attenuated phase-shifting mask used for forming the desired pattern 50 of FIG. 1A, and FIG. 4B is a cross-sectional view taken on line C-C' of FIG. 4A. In FIGS. 4A and 4B, like reference numerals are used to refer to like elements of the photomask of FIGS. 1B through 1D so as to avoid repetition of the description.

Also in the photomask of FIGS. 4A and 4B, a light-shielding portion 14 is provided on a transparent substrate 11 merely around each second opening 13B in the same manner as in the photomask of FIGS. 1B through 1D. However, a part (with an HT width $W_{HT}$) of a halftone portion 12 is provided between the second opening 13B and the light-shielding portion 14 in the photomask of FIGS. 4A and 4B differently from the photomask of FIGS. 1B through 1D.

A material generally used for a light-shielding portion of a photomask, such as Cr, CrO or CrNO, has lower etching resistance against an acid as compared with a material used for a halftone portion (such as MoSiO, MoSiNO, TaSiO, TaSiON, CrFO or CrFNO). Accordingly, in mask cleaning using an acid optimized for a halftone portion, a pattern of a light-shielding portion easily shrinks. Therefore, in the case where a light-shielding portion withdraws from the edge of an opening, namely, when the HT width $W_{HT}$ is increased, light in a phase difference of 180 degrees with respect to light passing through the opening passes through the halftone portion disposed between the light-shielding portion and the opening. As a result, the dimension of a transferred pattern of the opening is smaller than a desired dimension. The dimensional change of the transferred pattern of the opening per unit change of the HT width $W_{HT}$, namely, an MEF (mask error factor) of the HT width $W_{HT}$ (hereinafter referred to as the HTMEF) against the dimension of the transferred pattern of the opening, has a relatively large value when the HT width $W_{HT}$ is small and has a relatively small value when the HT width $W_{HT}$ is large, and has a substantially constant value when the HT width $W_{HT}$ is larger than a given width. Therefore, the HT width $W_{HT}$ is preferably set in this embodiment so that dimensional change of a transferred pattern of an opening can be small (namely, so that the HTMEF can be small) even when the HT width $W_{HT}$ is varied.

Figure 5:
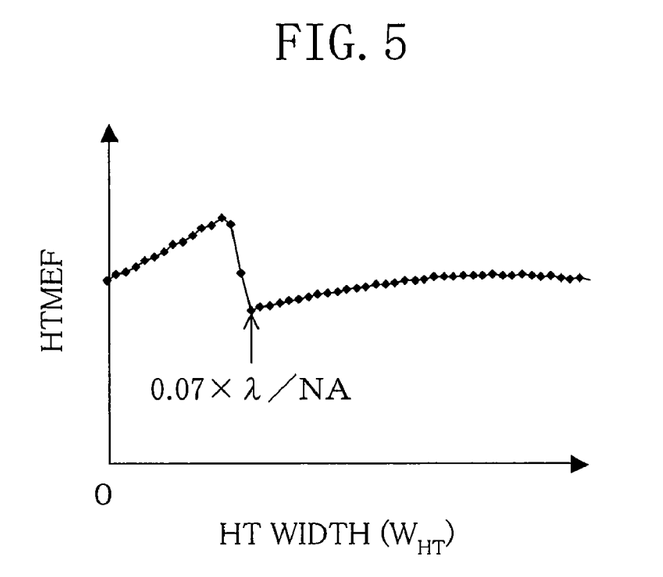
FIG. 5 is a diagram for showing the relationship, obtained by the present inventors through simulation, between the width of a part of a halftone portion disposed between the light-shielding portion and an opening and MEF in the photomask of the embodiment of the invention.

FIG. 5 shows the relationship between the HT width $W_{HT}$ and the HTMEF obtained by the present inventors through simulation. As shown in FIG. 5, as the HT width $W_{HT}$ is increased from 0, the MEF is increased at first, and there is an inflection point in the vicinity of an HT width $W_{HT}$ of 0.07× λ/NA, and when the HT width $W_{HT}$ exceeds this point, the MEF has a substantially constant value. In other words, when the HT width $W_{HT}$ is set to be not less than 0.07×λ/NA, the HTMEF can be made small.

On the other hand, when the HT width $W_{HT}$ is too large, there arises a problem of the occurrence of a side lobe. As described above, a side lobe is caused due to a secondary peak of the light intensity derived from diffraction of light caused at the edge of an opening, and therefore, it is caused in a position away from the edge of the opening by a distance defined by the numerical aperture NA and the wavelength λ. Accordingly, when the HT width $W_{HT}$ is not more than a given value, the position of a secondary peak can be shielded by a light-shielding portion, and hence, the occurrence of a side lobe can be prevented.

Figure 6:
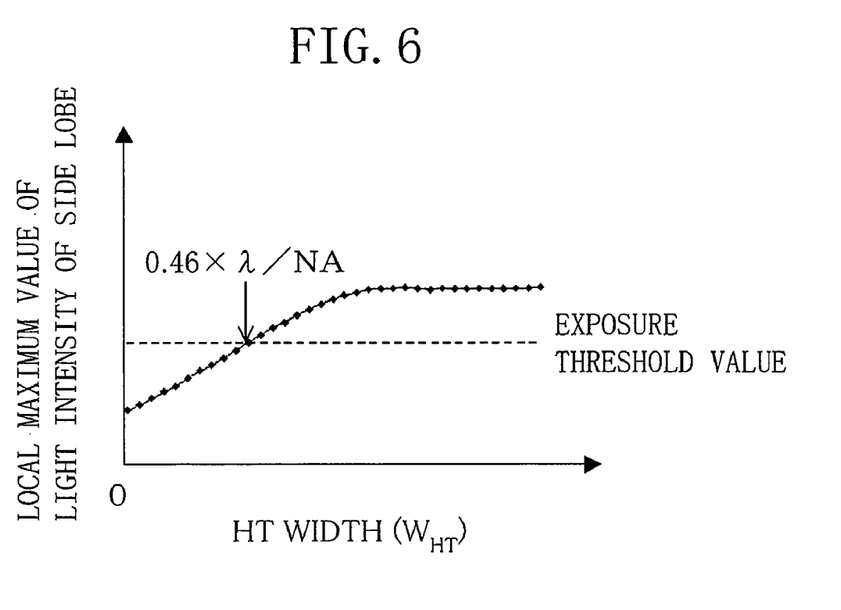
FIG. 6 is a diagram for showing the relationship, obtained by the present inventors through simulation, between the width of the part of the halftone portion disposed between the light-shielding portion and the opening and the local maximum value of the light intensity of the side lobe in the photomask of the embodiment of the invention.

FIG. 6 shows the relationship between the HT width $W_{HT}$ and the local maximum value Imax of the light intensity of a side lobe obtained by the present inventors through simulation. As shown in FIG. 6, as the HT width $W_{HT}$ is increased, the local maximum value Imax of a side lobe is increased, and when the HT width $W_{HT}$ exceeds 0.46×λ/NA, the local maximum value Imax exceeds the exposure threshold value. In other words, when the HT width $W_{HT}$ is set to be not more than 0.46×λ/NA, the occurrence of a side lobe can be prevented.

As described so far, in the case where the photomask shown in FIGS. 4A and 4B simultaneously includes first openings 13A each having a first dimension S1 not more than 0.5×λ/NA and second openings 13B each having a second dimension S2 larger than 0.5×λ/NA, the HT width $W_{HT}$ of the part of the halftone portion 12 disposed between each second opening 13B and the light-shielding portion 14 is set to be not less than 0.07×λ/NA and not more than 0.46×λ/NA and the Cr width $W_{Cr}$ of the light-shielding portion 14 is set to be not less than 0.63×λ/NA and not more than 3.7×λ/NA as described above. In this manner, while suppressing the HTMEF, the occurrence of a side lobe is prevented as well as the occurrence of a defect derived from an insoluble layer resulting from a completely unexposed region can be prevented.

Figure 7:
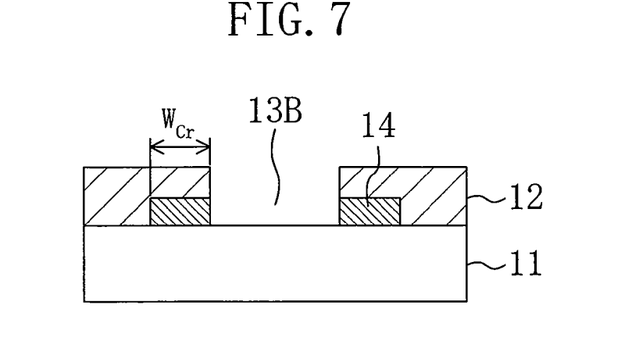
FIG. 7 is a cross-sectional view for showing a variation of the photomask according to the embodiment of the invention.

FIG. 7 is a cross-sectional view for showing another example of the photomask according to the embodiment of the invention, and specifically shows an exemplified variation of the cross-sectional structure shown in FIG. 1D, that is, a cross-sectional view taken on line B-B' of FIG. 1B crossing the second opening 13B. Specifically, in the photomask of FIG. 7, a light-shielding portion 14 is provided to be in contact with a second opening 13B. Although the light-shielding portion 14 is formed on the halftone portion 12 to be disposed around each second opening 13B in the photomask shown in FIGS. 1B through 1D, the light-shielding portion 14 is formed directly on a portion of a transparent substrate 11 disposed around the second opening 13B, and a halftone portion 12 is formed so as to cover the light-shielding portion 14 and surround the second opening 13B in the photomask of FIG. 7.

In employing the photomask structure shown in FIG. 7, even when a first opening 13A with a first dimension S1 not more than 0.5×λ/NA and a second opening 13B with a second dimension S2 larger than 0.5×λ/NA are simultaneously present, the occurrence of a side lobe can be prevented as well as the occurrence of a defect derived from an insoluble layer resulting from a completely unexposed region can be prevented by setting the Cr width $W_{Cr}$ of the light-shielding portion 14 in the same manner as in the photomask shown in FIGS. 1B through 1D.

Figure 8:
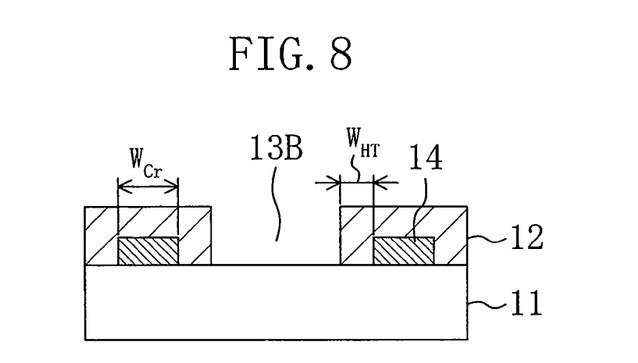
FIG. 8 is a cross-sectional view for showing another variation of the photomask according to the embodiment of the invention.

FIG. 8 is a cross-sectional view for showing still another example of the photomask according to the embodiment of the invention, and specifically shows an exemplified variation of the cross-sectional structure shown in FIG. 4B, that is, a cross-sectional view taken on line C-C' of FIG. 4A crossing the second opening 13B. Specifically, in the photomask of FIG. 8, a part (with an HT width $W_{HT}$) of a halftone portion 12 is disposed between a second opening 13B and a light-shielding portion 14. Although the light-shielding portion 14 is formed on the halftone portion 12 to be disposed around each second opening 13B in the photomask shown in FIGS. 4A and 4B, the light-shielding portion 14 is formed directly on a portion of a transparent substrate 11 disposed around the second opening 13B, and the halftone portion 12 is formed so as to cover the light-shielding portion 14 and surround the second opening 13B in the photomask of FIG. 8.

In employing the photomask structure shown in FIG. 8, even when a first opening 13A with a first dimension S1 not more than 0.5×λ/NA and a second opening 13B with a second dimension S2 larger than 0.5×λ/NA are simultaneously present, the occurrence of a side lobe can be prevented as well as the occurrence of a defect derived from an insoluble layer resulting from a completely unexposed region can be prevented while suppressing the HTMEF by setting the Cr width $W_{Cr}$ of the light-shielding portion 14 and the HT width $W_{HT}$ of the halftone portion 12 in the same manner as in the photomask shown in FIGS. 4A and 4B.

Figure 9:
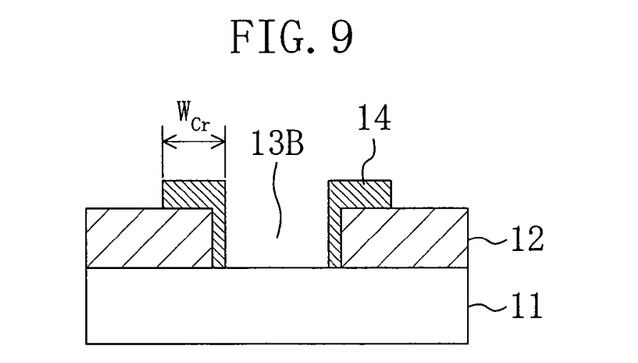
FIG. 9 is a cross-sectional view for showing still another variation of the photomask according to the embodiment of the invention.

FIG. 9 is a cross-sectional view for showing still another example of the photomask according to the embodiment of the invention, and specifically shows an exemplified variation of the cross-sectional structure shown in FIG. 1D, that is, a cross-sectional view taken on line B-B' of FIG. 1B crossing the second opening 13B. Specifically, in the photomask of FIG. 9, a light-shielding portion 14 is provided so as to be in contact with the second opening 13B. Although the side faces of the halftone portion 12 and the light-shielding portion 14 disposed on the side of the second opening 13B are continuously formed at the same level in the photomask shown in FIGS. 1B through 1D, the light-shielding portion 14 is formed on a halftone portion 12 surrounding the second opening 13B so as to cover the side face of the halftone portion 12 disposed on the side of the second opening 13B in the photomask of FIG. 9. In the photomask of FIG. 9, the Cr width $W_{Cr}$ of the light-shielding portion 14 is defined as a distance from an edge of the light-shielding portion 14 on the side of the second opening 13B to an opposite edge of the light-shielding portion 14. Furthermore, in the photomask of FIG. 9, a second dimension S2 of the second opening 13B is defined as a distance between the edges of the light-shielding portion 14.

In employing the photomask structure shown in FIG. 9, even when a first opening 13A with a first dimension S1 not more than $0.5 \times \lambda/NA$ and a second opening 13B with a second dimension S2 larger than $0.5 \times \lambda/NA$ are simultaneously present, the occurrence of a side lobe can be prevented as well as the occurrence of a defect derived from an insoluble layer resulting from a completely unexposed region can be prevented by setting the Cr width $W_{Cr}$ of the light-shielding portion 14 in the same manner as in the photomask shown in FIGS. 1B through 1D.

Although the light-shielding portion 14 is provided around each second opening 13B so as to completely surround the second opening 13B in all the aforementioned exemplified structures of the photomask of this embodiment, the light-shielding portion 14 need not completely surround the second opening 13B. For example, even when the light-shielding portion 14 is provided at least in a region where a side lobe may occur (namely, in the position of a secondary peak on a photomask) as shown in plan views of FIGS. 10A through 10D (each of which shows the plane structure of and around the second opening 13B), similar effects as those attained by any of the aforementioned photomask structures can be attained. Moreover, when the light-shielding portion 14 is disconnected at the corners of the second opening 13B as shown in FIGS. 10A through 10D, a pattern with a high rectangular property can be advantageously obtained. Specifically, since the halftone portion 12 is present instead of the light-shielding portion 14 around the corners of the second opening 13B, the contrast attained around the corners of the second opening 13B is improved, resulting in improving the transfer accuracy of the rectangular second opening 13B, namely, the rectangular property of the transferred pattern.

Specifically, in the photomask of FIG. 1A, each of disconnected parts of a light-shielding portion 14 has the same length as a corresponding side of a second opening 13B in a rectangular shape and is in contact with the corresponding side.

Figure 10A:
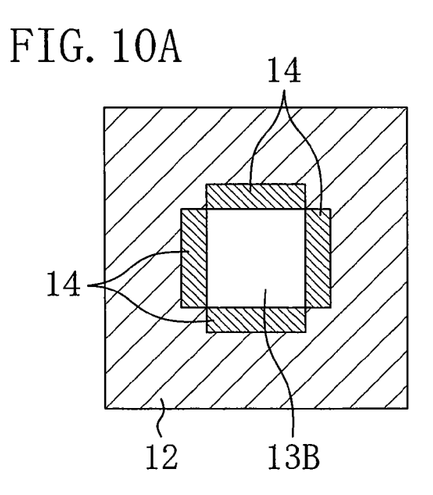
FIGS. 10A, 10B, 10C and 10D are plan views for showing variations of the photomask according to the embodiment of the invention.
Figure 10B:
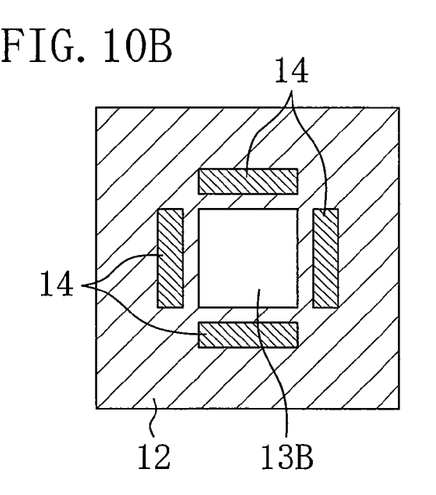

In the photomask of FIG. 10B, each of disconnected parts of a light-shielding portion 14 has the same length as a corresponding side of a second opening 13B in a rectangular shape and a part of a halftone portion 12 is present between each disconnected part of the light-shielding portion 14 and the second opening 13B.

Figure 10C:
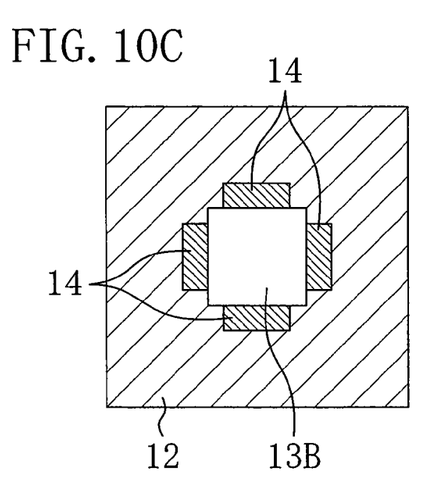

In the photomask of FIG. 10C, each of disconnected parts of a light-shielding portion 14 has a length shorter than a corresponding side of a second opening 13B in a rectangular shape and is in contact with the corresponding side.

Figure 10D:
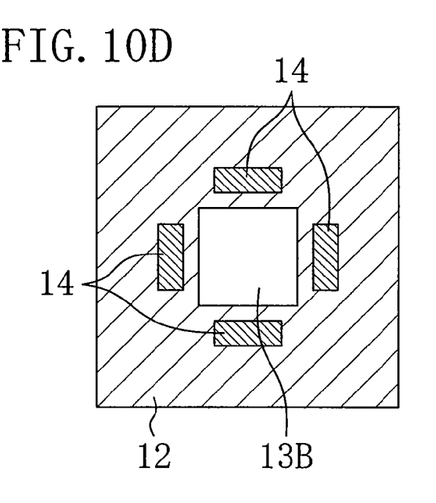

In the photomask of FIG. 10D, each of disconnected parts of a light-shielding portion 14 has a length shorter than a corresponding side of a second opening 13B in a rectangular shape and a part of a halftone portion 12 is present between each disconnected part of the light-shielding portion 14 and the second opening 13B.

In the case where each disconnected part of the light-shielding portion 14 has a length shorter than a corresponding side of the second opening 13B in a rectangular shape as in the photomasks of FIGS. 10C and 10D, a region where light having passed through the halftone portion 12 and light having passed through the second opening 13B cancel each other is increased in the vicinity of the edge of the second opening 13B, and therefore, the contrast can be improved and the MEF can be reduced.

Now, a pattern formation method using the photomask of this embodiment will be described with reference to the accompanying drawings.

Figure 11A:
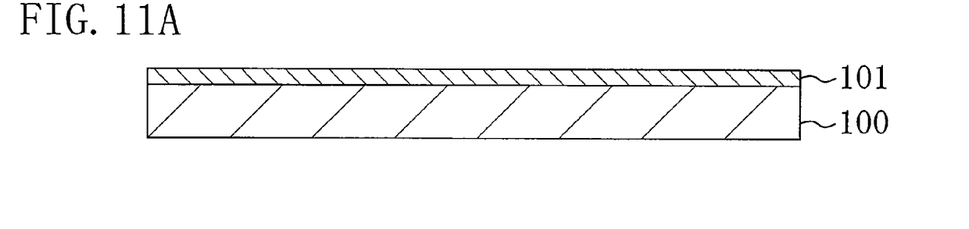
FIGS. 11A, 11B, 11C and 11D are cross-sectional views for showing procedures in a pattern formation method using the photomask according to the embodiment of the invention.
Figure 11B:
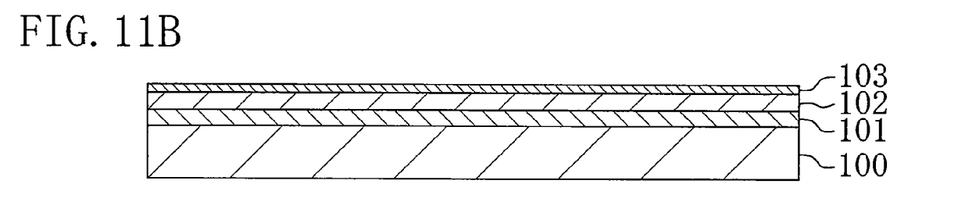
Figure 11C:
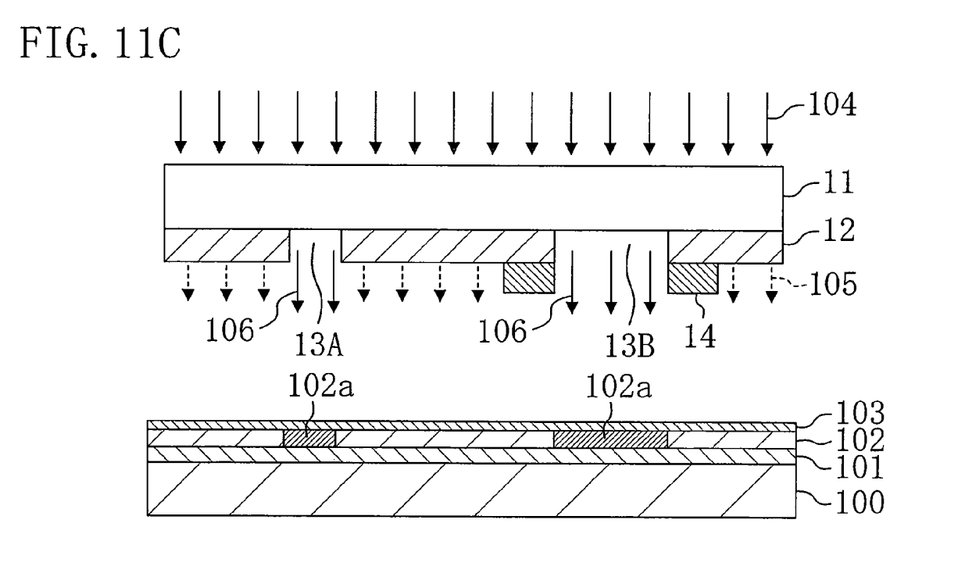

FIGS. 11A through 11D are cross-sectional views for showing procedures in the pattern formation method using the photomask of this embodiment. In FIG. 11C, like reference numerals are used to refer to like elements included in the photomask shown in FIGS. 1B through 1D so as to avoid repetition of the description.

First, as shown in FIG. 11A, a target film 101 of a metal film, an insulating film or the like is formed on a substrate 100, and thereafter, a positive resist film 102 is formed on the target film 101 as shown in FIG. 11B. At this point, when the immersion exposure is employed, a top coat 103 is further formed on the resist film 102 so as to coat the resist film 102.

Next, as shown in FIG. 11C, a photomask of this embodiment having a structure shown in, for example, FIGS. 1B through 1D is irradiated with exposing light 104 using a light source of, for example, ArF excimer laser. At this point, the resist film 102 is exposed by transmitted light 106 having passed through a first opening 13A and a second opening 13B of the photomask of this embodiment, resulting in forming latent portions 102a correspondingly to the openings 13A and 13B. It is merely the latent portions 102a that are irradiated with exposure energy sufficient for completely dissolving the resist in development subsequently performed. On the other hand, transmitted light 105 having passed though a halftone portion 12 (namely, a portion where no light-shielding portion 14 is formed) of the photomask of this embodiment is in an opposite phase to the transmitted light 106 but does not have sufficient energy for forming a latent portion.

When the Cr width $W_{Cr}$ of the light-shielding portion 14 provided around each second opening 13B in the photomask of this embodiment is set to be not less than $0.63 \times \lambda/NA$ and not more than $3.7 \times \lambda/NA$ as described above, there is no completely shielded region (completely unexposed region) with light intensity of 0 not only on the back of the halftone portion 12 but also on the back of the light-shielding portion 14, but these backs are also irradiated with light with intensity lower than an exposure threshold value. Accordingly, even when the top coat 103 is formed, adhesion between an insoluble layer, formed on a contact face between the resist film 102 and the top coat 103, and the resist film 102 is low, and hence, the occurrence of a resist defect derived from an insoluble layer can be prevented.

Figure 11D:
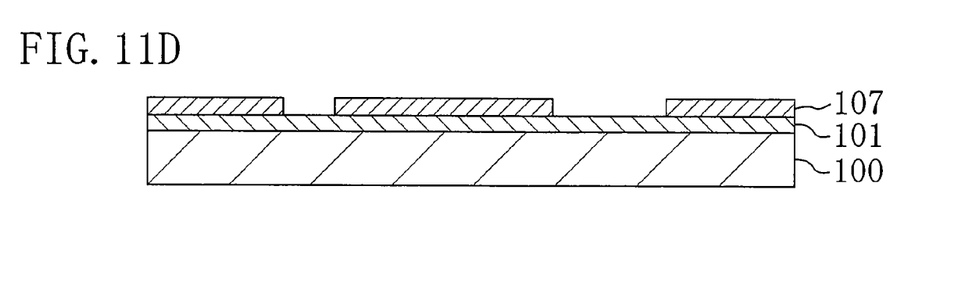

Next, the development is performed on the top coat 103 and the resist film 102 so as to remove the top coat 103 and the latent portions 102a of the resist film 102, resulting in forming a resist pattern 107 as shown in FIG. 11D.

Figure 12:
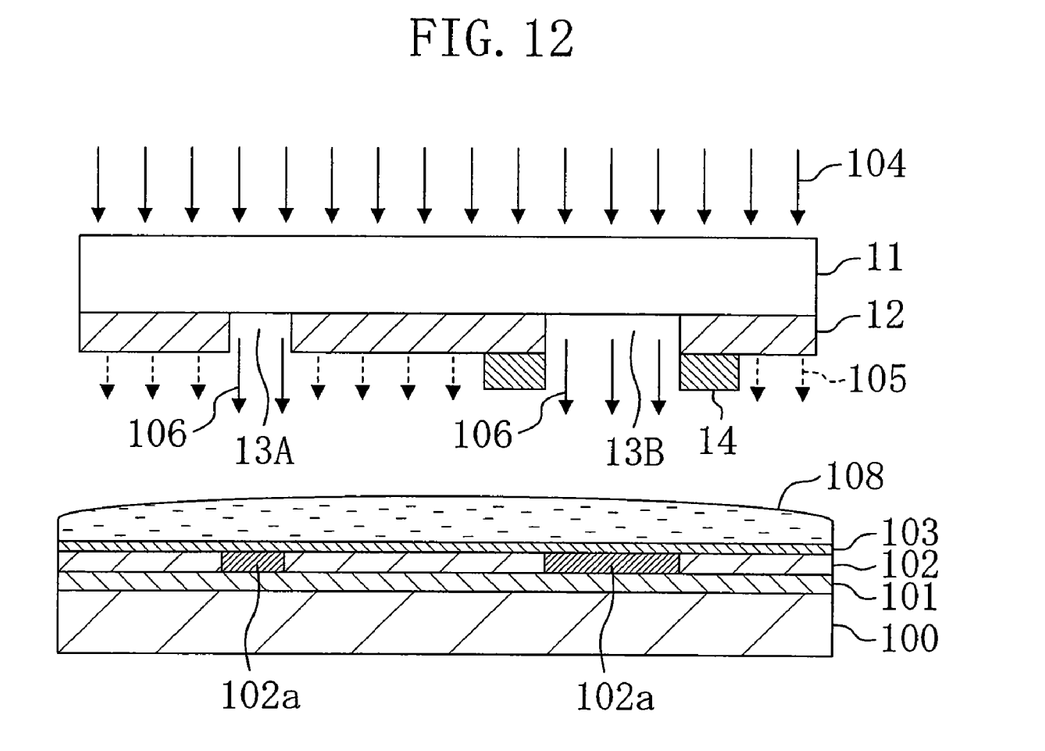
FIG. 12 is a cross-sectional view for explaining one procedure in a pattern formation method (employing immersion exposure process) using the photomask according to the embodiment of the invention.

FIG. 12 is a diagram for showing a procedure corresponding to that shown in FIG. 11C performed when the immersion exposure process is employed. In the case where the immersion exposure process is employed, a similar procedure to that of FIG. 11C is carried out except that the exposure is performed with an immersion liquid 108 present on the top coat 103 as shown in FIG. 12.

As described so far, according to the present embodiment, even in using an attenuated phase-shifting mask provided with a plurality of openings with different dimensions, and more particularly even in using this mask in combination with the ArF exposure process or the ArF immersion exposure process, the occurrence of a side lobe and the occurrence of a defect derived from an unexposed region can be simultaneously prevented in pattern formation. As a result, a fine LSI can be fabricated.

What is claimed is:

1. A photomask comprising:
    a transparent substrate having a transparent property against exposing light;
    a halftone portion formed on the transparent substrate;
    a first opening formed in the halftone portion and having a first dimension;
    a second opening formed in the halftone portion and having a second dimension larger than the first dimension; and
    a light-shielding portion formed on the transparent substrate around the second opening, wherein:
    the halftone portion transmits the exposing light in an opposite phase with respect to the first opening and the second opening, and
    the light-shielding portion has a width set to be not more than a maximum width with which an unexposed region is not formed by the exposing light having passed through the second opening and diffracting at an edge of the second opening toward a back of the light-shielding portion.

2. The photomask of claim 1,
    wherein the light-shielding portion is disconnected at a corner of the second opening.

3. The photomask of claim 2,
    wherein each disconnected part of the light-shielding portion has a length shorter than a corresponding side of the second opening.

4. The photomask of claim 1,
    wherein the light-shielding portion has a width set to be not less than a minimum width with which light intensity of a side lobe caused by diffraction, at an edge of the second opening, of the exposing light having passed through the second opening is not sufficient for sensitizing a resist.

5. The photomask of claim 1,
    wherein the photomask is designed for a given reduction projection optical system of an aligner and is set in the aligner, and
    the light-shielding portion of the photomask has a width not less than $(0.63 \times \lambda/NA) \times M$, where $\lambda$ is a wavelength of the exposing light, NA is numerical aperture of the reduction projection optical system of the aligner and M is a reduction ratio of the reduction projection optical system.

6. The photomask of claim 5, wherein the wavelength $\lambda$ is 193 nm, the numerical aperture NA is 1.2 and the reduction ratio M is 4.

7. The photomask of claim 1,
    wherein the photomask is designed for a given reduction projection optical system of an aligner and is set in the aligner, and
    the light-shielding portion of the photomask has a width not more than $(3.7 \times \lambda/NA) \times M$, where $\lambda$ is a wavelength of the exposing light, NA is numerical aperture of the reduction projection optical system of the aligner and M is a reduction ratio of the reduction projection optical system.

8. The photomask of claim 7, wherein the wavelength $\lambda$ is 193 nm, the numerical aperture NA is 1.2 and the reduction ratio M is 4.

9. The photomask of claim 1,
    wherein the light-shielding portion is in contact with the second opening.

10. The photomask of claim 1,
    wherein a part of the halftone portion is present between the second opening and the light-shielding portion.

11. The photomask of claim 10,
    wherein the photomask is designed for a given reduction projection optical system of an aligner and is set in the aligner, and
    the part of the halftone portion present between the second opening and the light-shielding portion has a width not less than $(0.07 \times \lambda/NA) \times M$, where $\lambda$ is a wavelength of the exposing light, NA is numerical aperture of the reduction projection optical system of the aligner and M is a reduction ratio of the reduction projection optical system.

12. The photomask of claim 11, wherein the wavelength $\lambda$ is 193 nm, the numerical aperture NA is 1.2 and the reduction ratio M is 4.

13. The photomask of claim 10,
    wherein the photomask is designed for a given reduction projection optical system of an aligner and is set in the aligner, and
    the part of the halftone portion present between the second opening and the light-shielding portion has a width not more than $(0.46 \times \lambda/NA) \times M$, where $\lambda$ is a wavelength of the exposing light, NA is numerical aperture of the reduction projection optical system of the aligner and M is a reduction ratio of the reduction projection optical system.

14. The photomask of claim 13, wherein the wavelength $\lambda$ is 193 nm, the numerical aperture NA is 1.2 and the reduction ratio M is 4.

15. The photomask of claim 1,
    wherein the photomask is designed for a given reduction projection optical system of an aligner and is set in the aligner, and
    the first dimension is not more than $(0.5 \times \lambda/NA) \times M$ and the second dimension is larger than $(0.5 \times \lambda/NA) \times M$, where $\lambda$ is a wavelength of the exposing light, NA is numerical aperture of the reduction projection optical system of the aligner and M is a reduction ratio of the reduction projection optical system.

16. The photomask of claim 15, wherein the wavelength $\lambda$ is 193 nm, the numerical aperture NA is 1.2 and the reduction ratio M is 4.

17. The photomask of claim 1,
    wherein the second opening is an overlay monitor pattern or a reticle position monitor pattern.

18. A pattern formation method using the photomask of claim 1, comprising the steps of:
    (a) forming a resist film on a substrate;
    (b) irradiating the resist film with the exposing light through the photomask; and
    (c) patterning the resist film by developing the resist film having been irradiated with the exposing light.

19. The pattern formation method of claim 18,
    wherein ArF excimer laser is used as an exposing light source in the step (b).

20. The pattern formation method of claim 19,
    wherein immersion exposure process is employed in the step (b).

21. The pattern formation method of claim 20,
    wherein the step (a) includes a sub-step of coating the resist film with a top coat.

22. The photomask of claim 1, wherein the second opening has a cross-shaped pattern.

23. The photomask of claim 22, wherein an outermost contour of the light-shielding portion has a cross-shape.

24. A photomask comprising:
    a transparent substrate having a transparent property against exposing light;
    a halftone portion formed on the transparent substrate;
    a first opening formed in the halftone portion and having a first dimension;

a second opening having a rectangular shape and being formed in the halftone portion and having a second dimension larger than the first dimension; and a light-shielding portion formed on the transparent substrate around the second opening, wherein:

the halftone portion transmits the exposing light in an opposite phase with respect to the first opening and the second opening, the light-shielding portion includes four rectangular light shielding portions, each of which is disposed along a corresponding one of four sides of the rectangular shape, the rectangular light-shielding portions are disconnected at corners of the rectangular shape of the second opening, and the light-shielding portion has a width set to be not more than a maximum width with which an unexposed region is not formed by the exposing light having passed through the second opening and diffracting at an edge of the second opening toward a back of the light-shielding portion.

\* \* \* \* \*